United States Patent
Harada et al.

(10) Patent No.: US 7,911,294 B2
(45) Date of Patent: Mar. 22, 2011

(54) VARIABLE-FREQUENCY BAND-ELIMINATION FILTER

(75) Inventors: Tetsuro Harada, Otsu (JP); Ken Tonegawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/542,734

(22) Filed: Aug. 18, 2009

(65) Prior Publication Data

US 2009/0295503 A1    Dec. 3, 2009

Related U.S. Application Data

(63) Continuation of application No. PCT/JP2008/052517, filed on Feb. 15, 2008.

(30) Foreign Application Priority Data

Mar. 2, 2007 (JP) ................................. 2007-052971

(51) Int. Cl.
*H03H 7/01* (2006.01)
(52) U.S. Cl. ........................................ 333/174; 333/176
(58) Field of Classification Search .................. 333/101, 333/32–34, 166–168, 174–176, 185, 202–205, 333/235
See application file for complete search history.

(56) References Cited

U.S. PATENT DOCUMENTS

| | | | | |
|---|---|---|---|---|
| 4,876,739 A | * | 10/1989 | Ma et al. | 455/266 |
| 5,932,522 A | * | 8/1999 | Bell et al. | 505/210 |
| 6,633,748 B1 | * | 10/2003 | Watanabe et al. | 455/78 |
| 2004/0246074 A1 | | 12/2004 | Humphrey | |
| 2009/0004918 A1 | * | 1/2009 | Papanide et al. | 439/620.03 |

FOREIGN PATENT DOCUMENTS

| | | |
|---|---|---|
| JP | 7-321509 A | 12/1995 |
| JP | 7-321586 A | 12/1995 |
| JP | 8-274504 A | 10/1996 |
| JP | 9-199996 A | 7/1997 |
| JP | 10-289342 A | 10/1998 |
| JP | 3351448 B2 | 11/2002 |
| JP | 2004-343696 A | 12/2004 |

OTHER PUBLICATIONS

Official communication issued in the International Application No. PCT/JP2008/052517, mailed on May 20, 2008.

* cited by examiner

*Primary Examiner* — Benny Lee
*Assistant Examiner* — Gerald Stevens
(74) *Attorney, Agent, or Firm* — Keating & Bennett, LLP

(57) ABSTRACT

A series resonance circuit defined by a series circuit including an inductor and a capacitor and a series resonance circuit defined by a series circuit including an inductor and a capacitor are connected in shunt to a signal line. A diode is disposed between the grounding end of the series resonance circuit and the ground, and a diode is disposed between the grounding end of the series resonance circuit and the ground. The connection point between the grounding end of the series resonance circuit and the diode is connected to the ground via a frequency shifting inductor in a conductive state at high frequency, and the connection point between the grounding end of the series resonance circuit and the diode is connected to the ground via a frequency shifting inductor in a conductive state at high frequency. A matching circuit defined by a multistage T-shape LCL circuit is disposed between the series resonance circuits.

5 Claims, 5 Drawing Sheets

VARIABLE-FREQUENCY BAND-ELIMINATION FILTER

BACKGROUND OF THE INVENTION

1. Field of the Invention

The present invention relates to variable-frequency filters, and more particularly, to a variable-frequency band-elimination filter for changing a frequency band using a switching element.

2. Description of the Related Art

Japanese Unexamined Patent Application Publication No. 10-289342 discloses a communication system in which switching between a plurality of filters having pass bands corresponding to different frequency bands is performed using switches.

That is, a switch is disposed at the input ends of two signal paths passing through filters having different filter characteristics, another switch is disposed at the output ends of the two signal paths, and switching between the filter characteristics is performed by operating each of these switches.

Japanese Unexamined Patent Application Publication No. 7-321586 discloses a filter in which filters having different characteristics are individually disposed in a plurality of paths and a frequency characteristic is changed by performing switching between these paths using switches.

Japanese Unexamined Patent Application Publication No. 7-321586 discloses a variable frequency band filter. In the variable frequency band filter, a low-pass notch filter is obtained by connecting LC series resonance circuits in shunt with each other, and a pass band and an attenuation band are changed in accordance with a used transmission channel by changing capacitance values using diodes. The configuration of the variable frequency band filter disclosed in Japanese Unexamined Patent Application Publication No. 7-321586 will be described with reference to FIG. 1.

As illustrated in FIG. 1, in the variable frequency band filter disclosed in Japanese Unexamined Patent Application Publication No. 7-321586, a first series resonance circuit defined by a capacitor C1 and a coil L1 which are on the side of an input terminal 1 and a second series resonance circuit defined by a capacitor C2 and a coil L2 which are on the side of an output terminal 2 are connected to each other via a coupling coil L4 as a parallel arm. Coils L3 and L5 are disposed in parallel to the first and second series resonance circuits, respectively. A first tap is disposed at the coil L1 which functions as a band elimination filter having the resonance frequency of the first series resonance circuit as an attenuation pole, and a second tap is disposed at the coil L2 which functions as a band elimination filter having the resonance frequency of the second series resonance circuit as an attenuation pole. A switching diode D1 and a high-frequency bypass capacitor C3 are disposed between the first tap and the ground, and a switching diode D2 and a high-frequency bypass capacitor C4 are disposed between the second tap and the ground. In the variable frequency band filter having the above-described configuration, it is possible to establish a short circuit between each of the taps at the coils L1 and L2 and the ground by applying a control voltage to the anodes of the diodes D1 and D2 and to change the frequencies of the attenuation poles.

However, in the systems disclosed Japanese Unexamined Patent Application Publication No. 10-289342 and Japanese Unexamined Patent Application Publication No. 9-199996, it is necessary to provide a plurality of filters so as to perform switching between predetermined frequencies. As a result, the size of a transmission/receiving module is increased, and a system configuration is complicated.

The variable frequency band filter disclosed in Japanese Unexamined Patent Application Publication No. 7-321586 is used as a low-pass filter having a band elimination characteristic. The pass band of the variable frequency band filter is only on the lower side of the resonance frequencies of the LC series resonance circuits connected in shunt to the signal line. Since the combination of a diode and a capacitor is used to change a capacitance value, the parasitic inductance component of the diode is added to the capacitor when the diode is in an ON state. As a result, the filter characteristics of the variable frequency band filter are deteriorated.

SUMMARY OF THE INVENTION

To overcome the problems described above, preferred embodiments of the present invention provide a small and low-cost variable-frequency band-elimination filter which has a simple configuration and which is capable of shifting a frequency while maintaining excellent filter characteristics.

A variable-frequency band-elimination filter according to a preferred embodiment of the present invention includes a plurality of series resonance circuits each of which is defined by an inductor and a capacitor connected in series to each other and includes one end as a grounding end, a matching circuit connected between the other ends of two of the plurality of series resonance circuits which are adjacent to each other, a switching element disposed between each of the grounding ends of the plurality of series resonance circuits and the ground so that the switching element is directly connected to the ground, a frequency shifting inductor through which a connection point between each of the grounding ends of the plurality of series resonance circuits and the switching element is connected to the ground in a conductive state at high frequency, and an input/output terminal connected to each of the other ends of two of the plurality of series resonance circuits which are disposed at both ends. Resonance frequencies of the plurality of series resonance circuits are set to be similar to, but not the same as, one another.

The matching circuit is preferably defined by a multistage T-shape circuit including inductors connected in series to one another and capacitors connected in shunt to a signal line.

The switching element is preferably an FET, for example.

A bias circuit arranged to apply a single control voltage to the switching element connected between each of the grounding ends of the plurality of series resonance circuits and the ground is preferably provided.

The switching element is preferably disposed on a surface of a multilayer substrate, and at least the frequency shifting inductor is preferably disposed on the surface of the multilayer substrate.

According to various preferred embodiments of the present invention, the following advantages are obtained. A plurality of series resonance circuits (LC series resonance circuits), each of which is connected in shunt with a signal line and is defined by an inductor and a capacitor, are provided, and a matching circuit is connected between two series resonance circuits adjacent to each other, such that a band-elimination filter including a plurality of resonators is obtained. Since the inductance of each of the series resonance circuits is changed by turning on or off a switching element, the number of components included in a variable-frequency band-elimination filter is reduced. This reduces the size and cost of the variable-frequency band-elimination filter. Furthermore, since a filter characteristic is changed using the switching element, it is not necessary to use a plurality of paths and a plurality of filters as described in Japanese Unexamined Patent Application Publication No. 10-289342 and Japanese Unexamined Patent Application Publication No. 9-199996. As a result, the number of elements of the filter is reduced. Still furthermore, since the inductance component of the switching element is added only to an inductor connected to the switching element when the switching element is in an ON state, it is possible to prevent the inductance component of the switching element from adversely affecting filter characteristics.

Since a matching circuit is preferably defined by a multistage T-shape circuit including inductors connected in series to one another and capacitors connected in shunt with each other, the design flexibility required to satisfy a matching condition is increased and a desired matching condition among a plurality of LC series resonance circuits can be obtained. That is, if a band elimination filter has a pass band on both sides of a variable resonance point, it is impossible to obtain a desired matching condition using a simple circuit and to obtain a sufficient band elimination characteristic when the inductance of each of series resonance circuits is changed by turning on or off a switching element. However, by using a multistage T-shape LCL circuit, it is possible to achieve matching among these series resonance circuits in a wide frequency range and to obtain a sufficient band elimination characteristic in both of the ON and OFF states of the switching element.

Since a FET (Field Effect Transistor) is preferably used as the switching element, it is possible to reduce a current that flows when the switching element is in the ON state. This results in reduced power consumption and a reduced size of a variable-frequency band-elimination filter.

Since a bias circuit arranged to apply a single control voltage to a switching element connected between each of the grounding ends of a plurality of LC series resonance circuits and the ground is provided, it is possible to control a frequency characteristic using a single power source. This results in a further reduced size of an entire circuit.

Since the switching elements, the inductors, the capacitors, and frequency shifting inductors are preferably provided on or in a multilayer substrate, it is possible to easily dispose these components on a circuit board of an electronic apparatus as a single small component.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

First Preferred Embodiment

Figure 1:
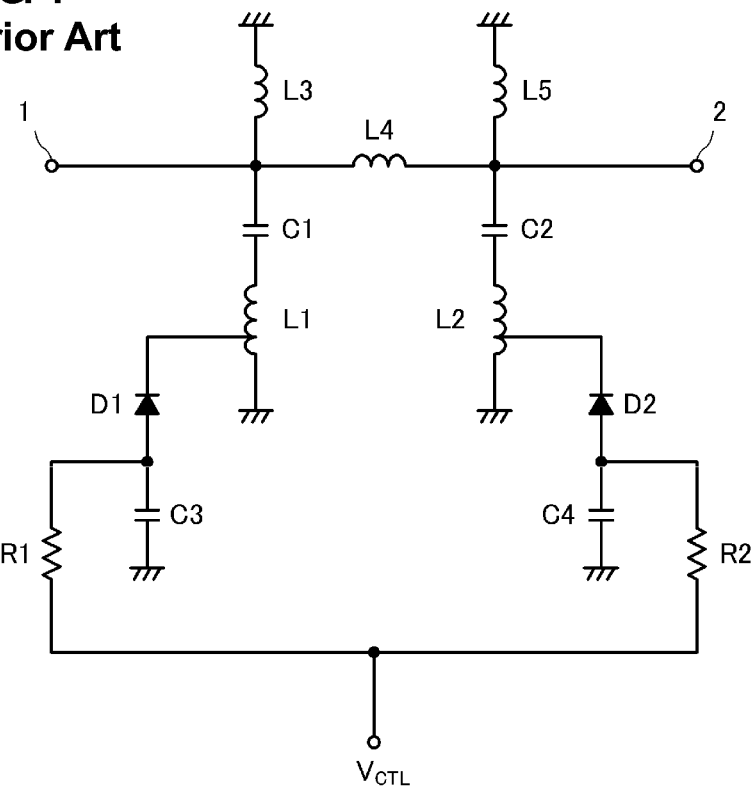
FIG. 1 is a circuit diagram of a variable frequency band filter disclosed in Japanese Unexamined Patent Application Publication No. 7-321586.
Figure 2:
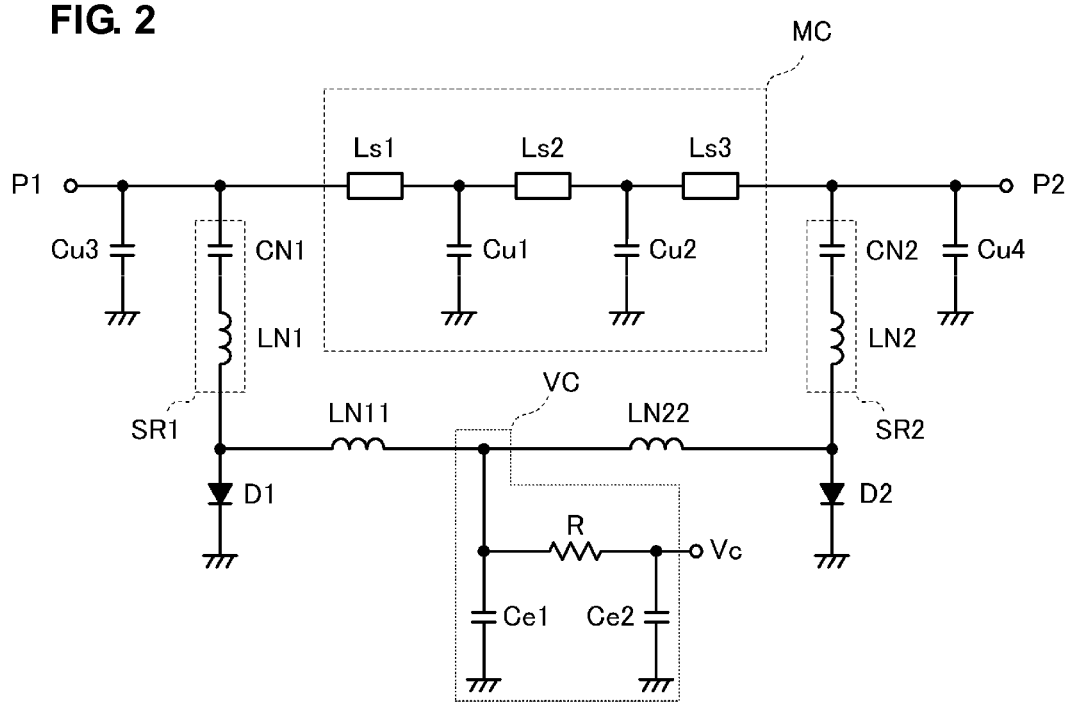
FIG. 2 is a circuit diagram of a variable-frequency band-elimination filter according to a first preferred embodiment of the present invention.

A variable-frequency band-elimination filter according to the first preferred embodiment of the present invention will be described with reference to FIGS. 2 to 5. FIG. 2 is a circuit diagram of a variable-frequency band-elimination filter according to the first preferred embodiment of the present invention.

Referring to FIG. 2, a first series resonance circuit SR1 is defined by a series circuit including an inductor LN1 and a capacitor CN1, and a second series resonance circuit SR2 is defined by a series circuit including an inductor LN2 and a capacitor CN2.

A matching circuit MC is disposed between the first series resonance circuit SR1 and the second series resonance circuit SR2. The matching circuit MC is defined by a two-stage T-shape circuit including inductors Ls1, Ls2, and Ls3 connected in series to one another and capacitors Cu1 and Cu2 connected in shunt with each other. A first-stage T-shape circuit is defined by the inductors Ls1 and Ls2 and the capacitor Cu1. A second-stage T-shape circuit is defined by the inductors Ls2 and Ls3 and the capacitor Cu2.

Diodes D1 and D2 that function as switching elements are disposed between the grounding end of the series resonance circuits SR1 and SR2, respectively, and the ground.

An input/output terminal P1 is connected to the other end (hereinafter referred to as an input/output terminal) of the first series resonance circuit SR1 which is opposite to the grounding end of the first series resonance circuit SR1. An input/output terminal P2 is connected to the other end (hereinafter referred to as an input/output terminal) of the second series resonance circuit SR2 which is opposite to the grounding end of the second series resonance circuit SR2. A connection point between the grounding end of the first series resonance circuit SR1 and the diode D1 is connected to the ground via a frequency shifting inductor LN11 and a capacitor Ce1. A connection point between the grounding end of the second series resonance circuit SR2 and the diode D2 is connected to the ground via a frequency shifting inductor LN22 and the capacitor Ce1. A resistor R is connected between a control terminal Vc that applies a bias voltage (control voltage) to the diodes D1 and D2 and a connection point between the frequency shifting inductors LN11 and LN22. A capacitor Ce2 is connected between the control terminal Vc and the ground. The capacitor Ce2 is included so as to assist the capacitor Ce1 and ensure a large capacity.

A capacitor Cu3 is connected between the input/output terminal P1 and the ground, and a capacitor Cu4 is connected between the input/output terminal P2 and the ground. A lowpass filter is defined by the inductors Ls1, Ls2, and LS3 connected in series to one another and the capacitors Cu3 and Cu4.

Figure 3A:
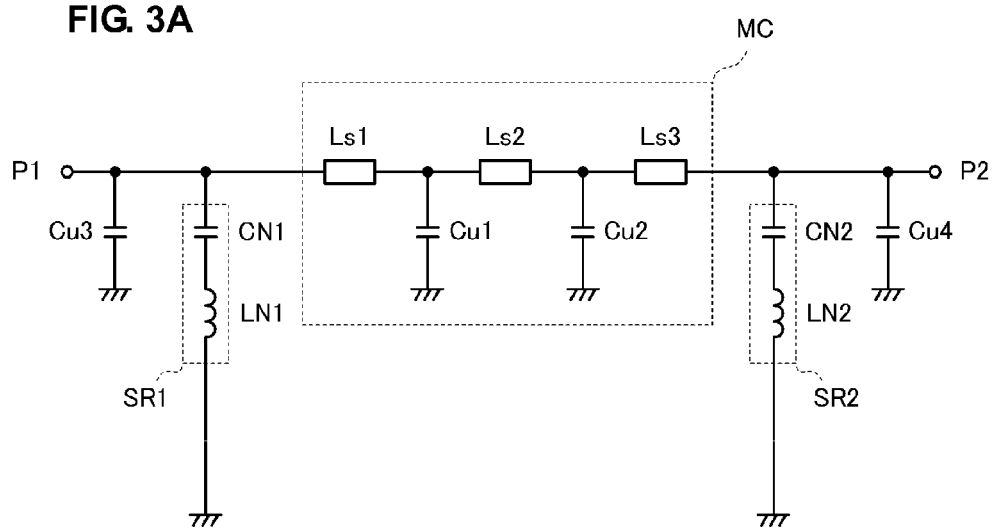
FIGS. 3A and 3B illustrate equivalent circuits of a variable-frequency band-elimination filter when diodes are in an ON state and an OFF state.
Figure 3B:
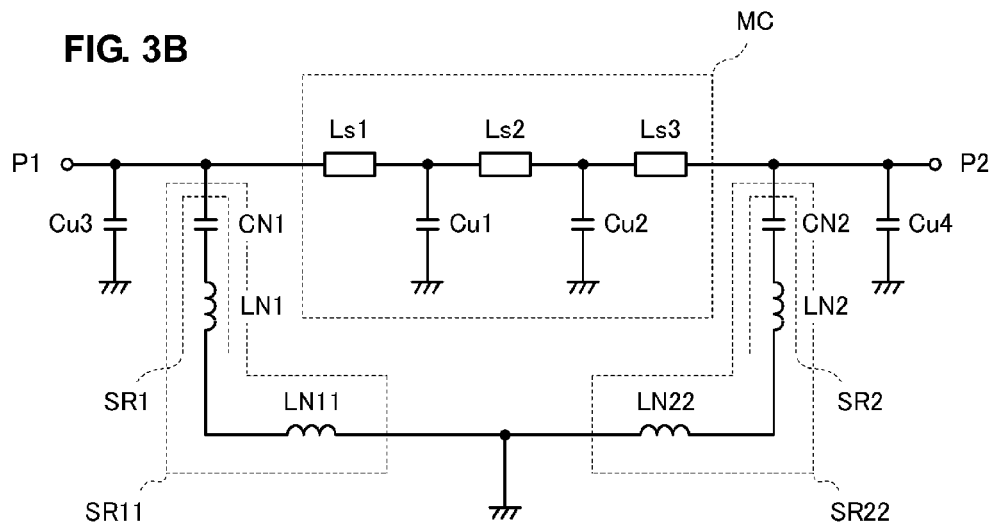

FIG. 3A illustrates an equivalent circuit of a variable-frequency band-elimination filter when the diodes D1 and D2 are in an ON state in the circuit illustrated in FIG. 2. FIG. 3B illustrates an equivalent circuit of the variable-frequency band-elimination filter when the diodes D1 and D2 are in an OFF state in the circuit illustrated in FIG. 2.

If a predetermined positive voltage is applied to the control terminal Vc illustrated in FIG. 2, the diodes D1 and D2 are turned on. In this state, since the inductance components of the diodes D1 and D2 are much smaller than the inductance values of the frequency shifting inductors LN11 and LN22, the frequency shifting inductors LN11 and LN22 and a bias circuit (defined by the capacitors Ce1 and Ce2 and the resistor R) connected to the frequency shifting inductors LN11 and LN22 are virtually non-existent. That is, the equivalent circuit illustrated in FIG. 3A is obtained.

If a voltage of zero volts or a negative voltage is applied to the control terminal Vc illustrated in FIG. 2, the diodes D1 and D2 are turned off. Since the inductances of the frequency shifting inductors LN11 and LN22 act and the capacitor Ce1 is in a conductive state in a conductive state at high frequency, the equivalent circuit illustrated in FIG. 3B is obtained.

Accordingly, the first series resonance circuits SR1 and SR2 are connected in series to the frequency shifting inductors LN11 and LN22, respectively. The resonance frequencies of new series resonance circuits SR11 and SR22 are shifted to frequencies lower than those of the series resonance circuits illustrated in FIG. 3A.

Thus, if the diodes D1 and D2 are directly connected to the ground without using a capacitor C and an LC parallel resonance circuit, the capacitances of the diodes D1 and D2 are not added to the resonance circuits when the diodes D1 and D2 are in the OFF state as illustrated in the equivalent circuit in FIG. 3B. As a result, the deviation or variation of a resonance frequency can be significantly reduced. Since a voltage is applied to the diodes D1 and D2 via the frequency shifting inductors LN11 and LN22, respectively, a choke coil or other suitable circuit element is not required at a control terminal portion. As a result, the size of a filter can be reduced. Furthermore, by making the resonance frequencies of the series resonance circuits closer to each other, it is possible to broaden an elimination band.

Figure 4A:
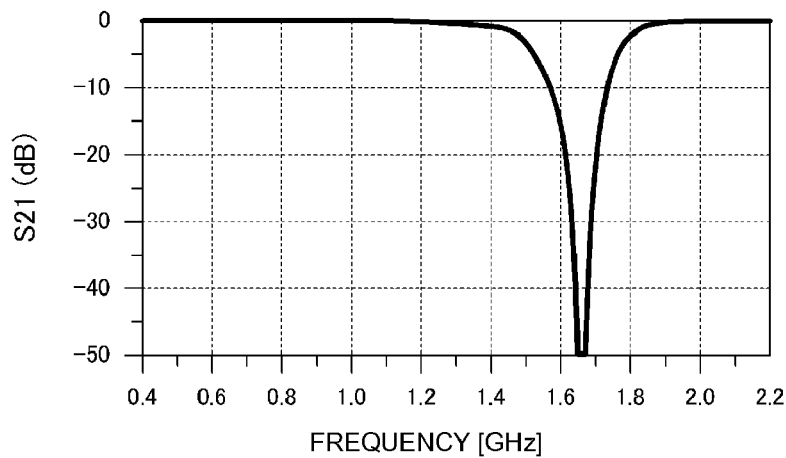
FIGS. 4A and 4B illustrate the transmission characteristics of the equivalent circuits illustrated in FIGS. 3A and 3B.
Figure 4B:
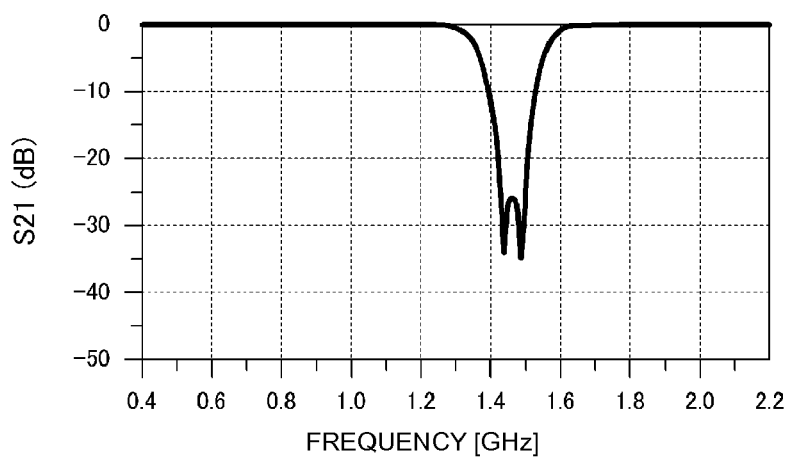

FIG. 4A illustrates the transmission characteristics of the equivalent circuit illustrated in FIG. 3A. FIG. 4B illustrates the transmission characteristics of the equivalent circuit illustrated in FIG. 3B.

When the diodes D1 and D2 illustrated in FIG. 2 are in the ON state, an attenuation band of a predetermined bandwidth having the center at about 1.67 GHz in this example is generated in accordance with the resonance frequencies of the series resonance circuits SR1 and SR2 that are connected in shunt with a transmission line.

When the diodes D1 and D2 illustrated in FIG. 2 are in the OFF state, an attenuation band of a predetermined bandwidth having the center at about 1.48 GHz in this example is generated in accordance with the resonance frequencies of the series resonance circuits SR11 and SR22 illustrated in FIG. 3B. The matching circuit MC defined by the inductors Ls1, Ls2, and Ls3 and the capacitors Cu1 and Cu2 performs the matching between the two series resonance circuits in a range including the above-described two frequency bands. Accordingly, the matching between the two series resonance circuits can be achieved in both of the ON and OFF states of the diodes D1 and D2, and the frequency range of an attenuation band can be shifted while maintaining a predetermined amount of attenuation.

Since the bias circuit VC arranged to apply a single control voltage to the diodes D1 and D2 that are connected between the first series resonance circuit SR1 and the ground and between the second series resonance circuit SR2 and the ground, respectively, is provided, a frequency characteristic can be controlled using a single power source. As a result, a configuration to control the application of a bias voltage can be simplified, and the size of an entire circuit can be reduced.

Figure 5:
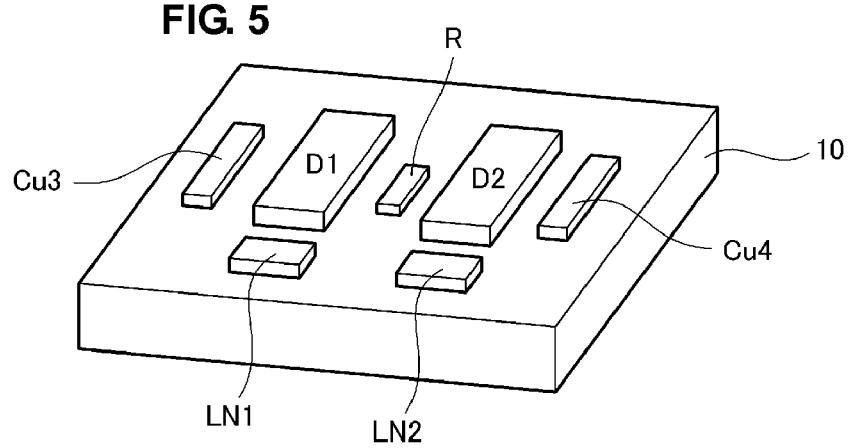
FIG. 5 is an enlarged external perspective view of a variable-frequency band-elimination filter.

FIG. 5 is an enlarged external perspective view of a variable-frequency band-elimination filter according to the first preferred embodiment of the present invention. Referring to FIG. 5, the diodes D1 and D2, the capacitors Cu3 and Cu4, the inductors LN1 and LN2, and the resistor R are preferably disposed on the upper surface of a multilayer substrate 10.

On the upper surface of the multilayer substrate 10, the frequency shifting inductors LN11 and LN22 may preferably be disposed. In this case, if an attenuation frequency is changed, it is only necessary to change the inductance values of frequency shifting inductors LN11 and LN22 without changing the multilayer substrate 10. Thus, it is possible to easily respond to a design change. Furthermore, since a chip inductor having a Q value greater than that of an inductor at a printing electrode provided on the multilayer substrate can be used, the attenuation characteristics of the series resonance circuits can be improved.

In the multilayer substrate 10, other inductors, other capacitors, and other resistors illustrated in FIG. 2 are preferably provided, for example. On the undersurface of the multilayer substrate 10, the input/output terminals P1 and P2, a ground terminal, and the control terminal Vc are preferably provided.

The multilayer substrate 10 is preferably made of ceramic or a resin, for example. In this example, surface mount components having high Q values are preferably used as the inductors LN1 and LN2 included in the series resonance circuits so as to obtain the excellent resonance characteristics of the series resonance circuits. However, if desired characteristics can be obtained, all of the inductors and the capacitors may preferably be embedded in the multilayer substrate 10.

Second Preferred Embodiment

Figure 6:
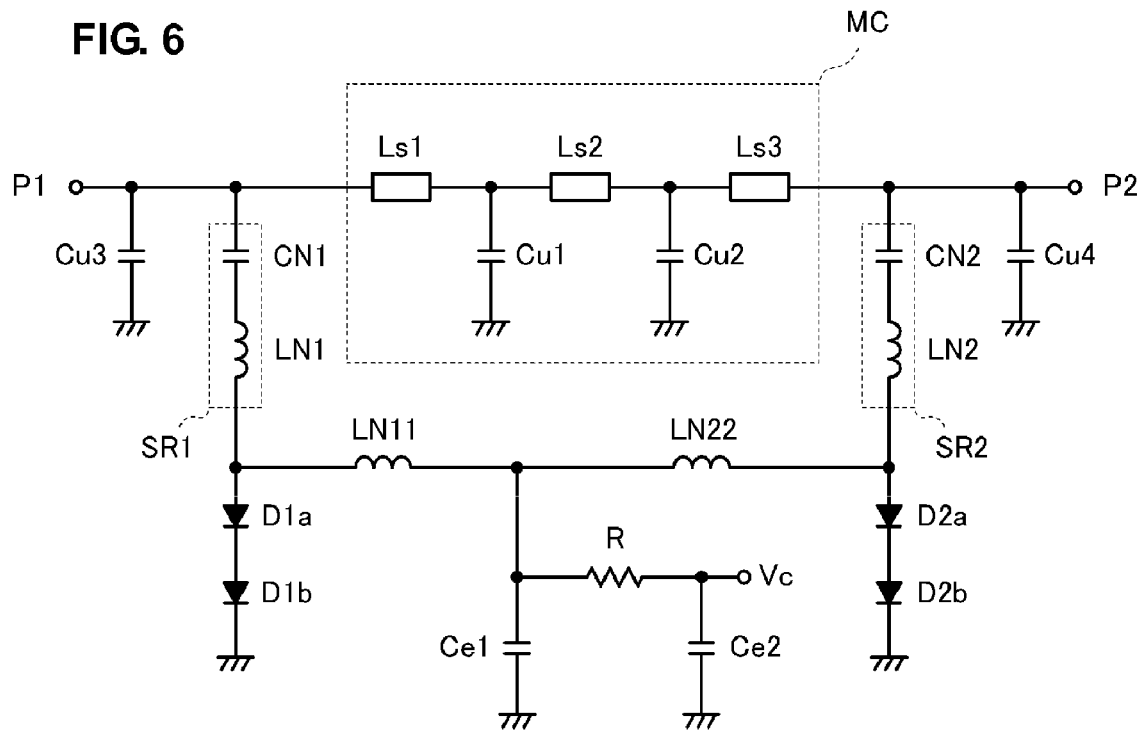
FIG. 6 is a circuit diagram of a variable-frequency band-elimination filter according to a second preferred embodiment of the present invention.

FIG. 6 is a circuit diagram of a variable-frequency band-elimination filter according to the second preferred embodiment of the present invention. A circuit according to the second preferred embodiment illustrated in FIG. 6 differs from the circuit according to the first preferred embodiment illustrated in FIG. 2 in that each switching element is defined by a series circuit including a plurality of diodes (two diodes in this example). That is, a series circuit including two diodes D1a and D1b is disposed between the grounding end of the first series resonance circuit SR1 and the ground, and a series circuit including two diodes D2a and D2b is disposed between the grounding end of the second series resonance circuit SR2 and the ground.

Thus, by connecting a plurality of diodes in series, an equivalent capacitance component can be reduced when these diodes are in the OFF state. Furthermore, by turning on or off the diodes D1a and D1b connected in series to each other and the diodes D2a and D2b connected in series to each other, the amount of frequency shift can be further increased. Still furthermore, the change in voltage applied to a single diode can be reduced so as to improve a harmonic characteristic.

Third Preferred Embodiment

Figure 7:
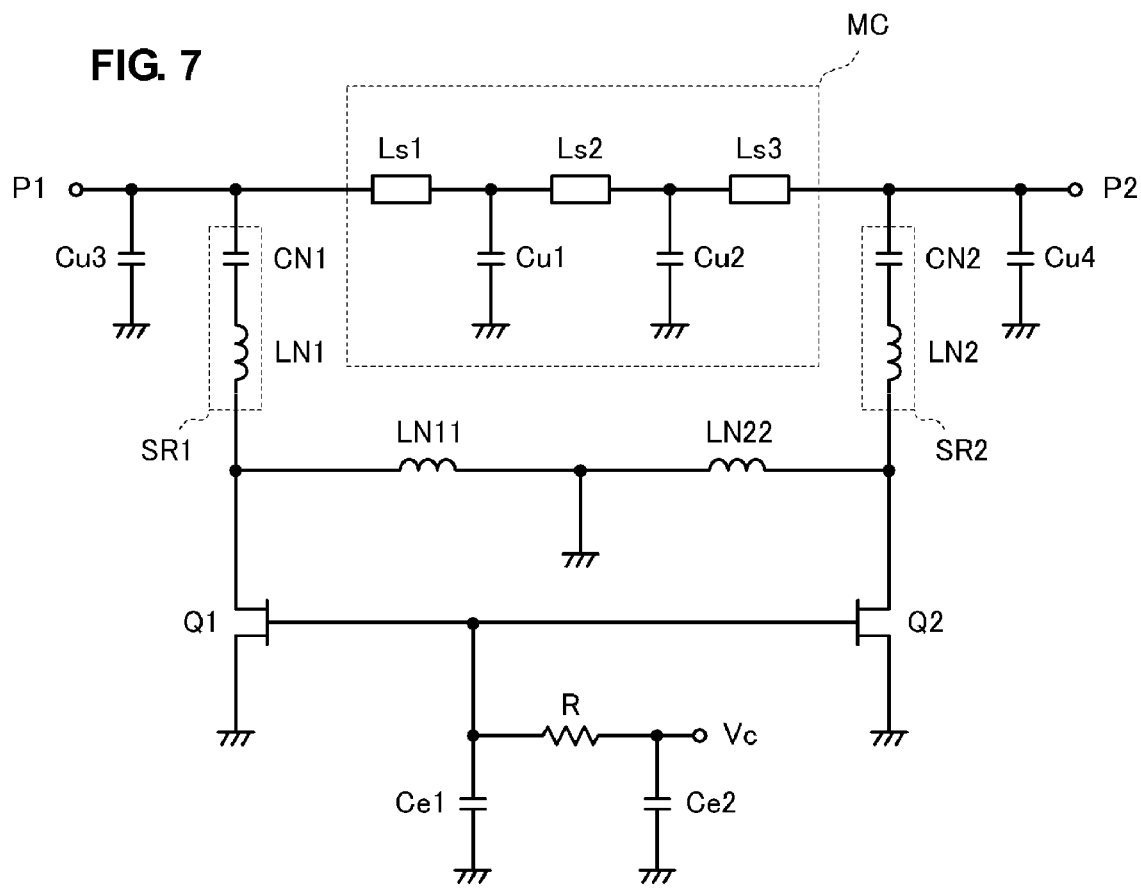
FIG. 7 is a circuit diagram of a variable-frequency band-elimination filter according to a third preferred embodiment of the present invention.

FIG. 7 is a circuit diagram of a variable-frequency band-elimination filter according to the third preferred embodiment of the present invention. In this example, a FET is preferably used as a switching element. That is, a FET Q1 is disposed between the grounding end of the first series resonance circuit SR1 and the ground, and a FET Q2 is disposed between the grounding end of the second series resonance circuit SR2 and the ground. The connection point between the grounding end of the first series resonance circuit SR1 and the FET Q1 is connected to the ground via the frequency shifting inductor LN11, and the connection point between the grounding end of the second series resonance circuit SR2 and the FET Q2 is connected to the ground via the frequency shifting inductor LN22.

A bias circuit including the capacitors Ce1 and Ce2 and the resistor R is disposed for the gates of the FETs Q1 and Q2.

In FIG. 7, if the FETs Q1 and Q2 are N-channel FETs and a predetermined positive voltage is applied to the control terminal Vc, the FETs Q1 and Q2 are turned on. If a voltage of zero volts or a predetermined negative voltage is applied to the control terminal Vc, the FETs Q1 and Q2 are turned off. When the FETs Q1 and Q2 are in the ON state, the grounding ends of the first series resonance circuit SR1 and the second series resonance circuit SR2 are connected to the ground with an extremely small inductance component and the equivalent circuit illustrated in FIG. 3A is obtained. When the FETs Q1 and Q2 are in the OFF state, the equivalent circuit illustrated in FIG. 3B is obtained. Accordingly, as in the first and second preferred embodiments, a center frequency can be changed in an elimination band using a control voltage.

Thus, by using a FET as a switching element, the value of a current used to control the ON or OFF state of each switching element can be minimized. This leads to lower power consumption of a variable-frequency band-elimination filter and a reduced size of the variable-frequency band-elimination filter.

Fourth Preferred Embodiment

Figure 8:
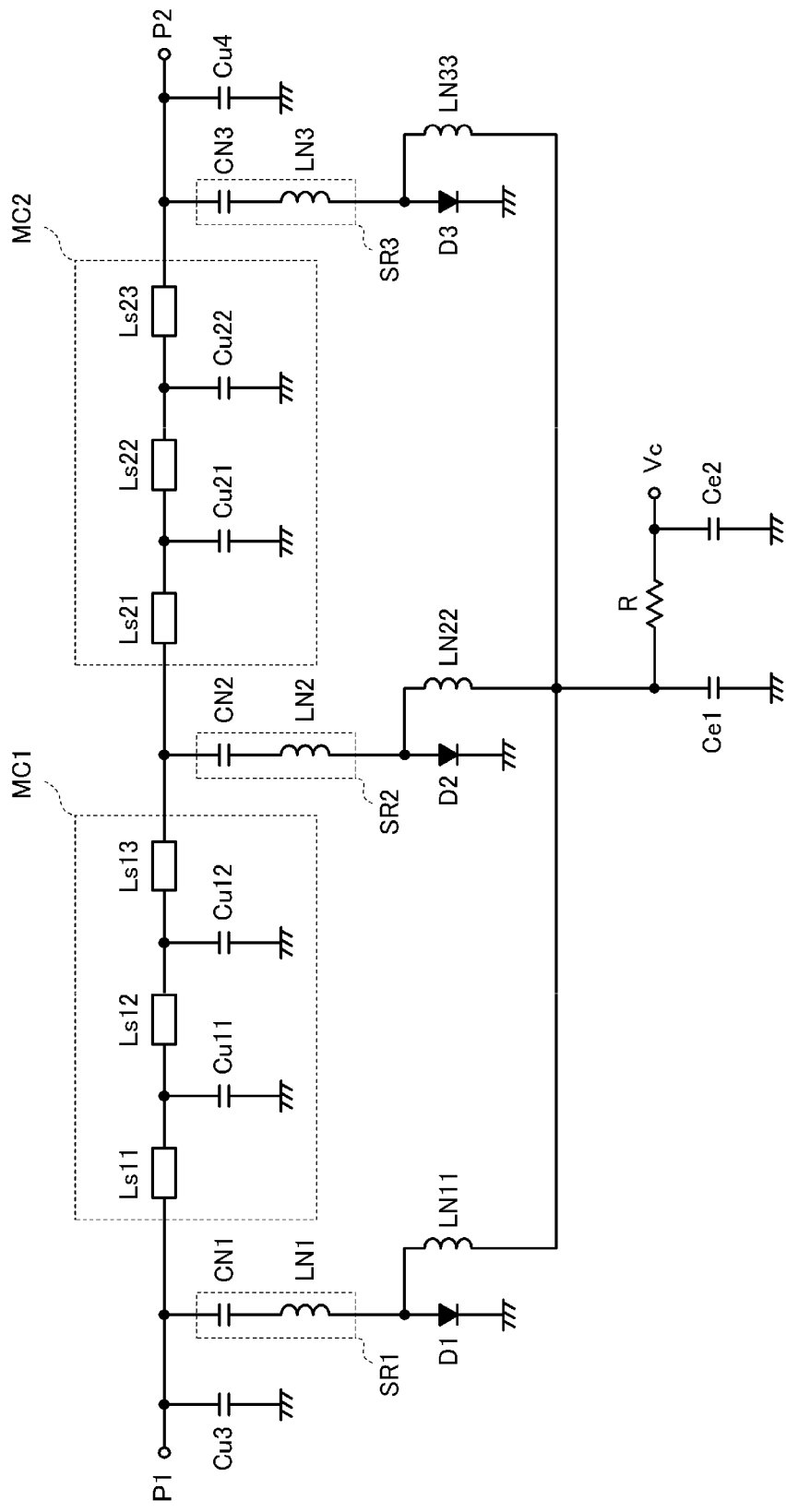
FIG. 8 is a circuit diagram of a variable-frequency band-elimination filter according to a fourth preferred embodiment of the present invention.

FIG. 8 is a circuit diagram of a variable-frequency band-elimination filter according to the fourth preferred embodiment of the present invention. In the first to third preferred embodiments, two series resonance circuits are connected in shunt to a signal line. However, in the fourth preferred embodiment, three series resonance circuits are preferably provided.

Referring to FIG. 8, the first series resonance circuit SR1 is defined by the series circuit of the inductor LN1 and the capacitor CN1, the second series resonance circuit SR2 is defined by the series circuit of the inductor LN2 and the capacitor CN2, and a third series resonance circuit SR3 is defined by an inductor LN3 and a capacitor CN3. A matching circuit MC1 that is defined by a two-stage T-shape circuit including inductors Ls11, Ls12, and Ls13 connected in series to one another and capacitors Cu11 and Cu12 connected in shunt with each other is disposed between the series resonance circuits SR1 and SR2. A matching circuit MC2 that is defined by a two-stage T-shape circuit including inductors Ls21, Ls22, and Ls23 connected in series to one another and capacitors Cu21 and Cu22 connected in shunt with each other is disposed between the series resonance circuits SR2 and SR3.

The diodes D1 and D2 and a diode D3 that define switching elements are disposed between the grounding end of the first series resonance circuit SR1 and the ground, between the grounding end of the second series resonance circuit SR2 and the ground, and between the grounding end of the third series resonance circuit SR3 and the ground, respectively.

Among the three series resonance circuit SR1, SR2 and SR3, each end, opposite to grounding end, of series resonance circuits SR1 and SR3 disposed at both sides is connected to the input/output terminals P1 and P2, respectively.

The connection point between the first series resonance circuit SR1 and the diode D1 is connected to the ground via the frequency shifting inductor LN11 and the capacitor Ce1, the connection point between the second series resonance circuit SR2 and the diode D2 is connected to the ground via the frequency shifting inductor LN22 and the capacitor Ce1, and the connection point between the third series resonance circuit SR3 and the diode D3 is connected to the ground via an frequency shifting inductor LN33 and the capacitor Ce1. The resistor R is connected between the control terminal Vc arranged to apply a bias voltage to the diodes D1, D2, and D3 and the connection point among the frequency shifting inductor LN11, LN22, and LN33. The capacitor Ce2 is connected between the control terminal Vc and the ground.

In FIG. 8, if a predetermined positive voltage is applied to the control terminal Vc, the diodes D1, D2, and D3 are turned on. If a voltage of zero volts or a predetermined negative voltage is applied to the control terminal Vc, the diodes D1, D2, and D3 are turned off.

When the diodes D1, D2, and D3 are in the ON state, the grounding ends of the series resonance circuits SR1, SR2, and SR3 are connected to the ground with an extremely small inductance component. Accordingly, each of the series resonance circuits SR1, SR2, and SR3 resonates at a frequency that is determined on the basis of the capacitance value of a corresponding capacitor and the inductance value of a corresponding inductor.

When the diodes D1, D2, and D3 are in the OFF state, the series resonance circuits SR1, SR2, and SR3 are connected in series to the frequency shifting inductors LN11, LN22, and LN33, respectively. Accordingly, the resonance frequency of each of the series resonance circuits is shifted to a lower frequency.

Thus, even if three or more series resonance circuits are used, a center frequency in an elimination band can be changed using a control voltage.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A variable-frequency band-elimination filter comprising:
    a plurality of series resonance circuits each of which includes an inductor and a capacitor connected in series to each other and a first end as a grounding end;
    a matching circuit connected between second ends of two of the plurality of series resonance circuits which are adjacent to each other;
    a switching element disposed between each of the grounding ends of the plurality of series resonance circuits and the ground so that the switching element is directly connected to the ground;
    a frequency shifting inductor via which a connection point between each of the grounding ends of the plurality of series resonance circuits and the switching element is connected to the ground in a conductive state at high frequency; and
    an input/output terminal connected to each of the second ends of two end series resonance circuits of the plurality of series resonance circuits which are at both ends of the plurality of series resonance circuits; wherein
    resonance frequencies of the plurality of series resonance circuits are similar to, but not the same as, one another; and the matching circuit is arranged to perform matching between the two of the plurality of series resonance circuits in a range including the resonance frequencies of the two of the plurality of series resonance circuits.

2. The variable-frequency band-elimination filter according to claim 1, wherein the matching circuit is defined by a multistage T-shape circuit including inductors connected in series to one another and capacitors connected in shunt to a signal line.

3. The variable-frequency band-elimination filter according to claim 1, wherein the switching element is a field effect transistor.

4. The variable-frequency band-elimination filter according to claim 1, further comprising a bias circuit arranged to apply a single control voltage to the switching element connected between each of the grounding ends of the plurality of series resonance circuits and the ground.

5. The variable-frequency band-elimination filter according to claim 1, wherein the switching element is disposed on a surface of a multilayer substrate, and at least the frequency shifting inductor is disposed on the surface of the multilayer substrate.

* * * * *